United States Patent [19]

Ovshinsky et al.

[11] Patent Number: 4,783,361

[45] Date of Patent: Nov. 8, 1988

[54] COATED LENSES

[75] Inventors: Stanford R. Ovshinsky, Bloomfield Hills; James D. Flasck, Rochester, both of Mich.

[73] Assignee: Ovonic Synthetic Materials Company, Inc., Troy, Mich.

[21] Appl. No.: 163,135

[22] Filed: Feb. 24, 1988

Related U.S. Application Data

[63] Continuation of Ser. No. 774,315, Sep. 10, 1985, abandoned, Continuation-in-part of Ser. No. 649,324, Sep. 10, 1984, Pat. No. 4,663,183.

[51] Int. Cl.$^4$ .......................... G02B 1/10; G02B 1/12; G02B 5/22; G02C 7/10

[52] U.S. Cl. .......................... 428/217; 350/1.1; 350/311; 350/438; 350/439; 351/44; 351/160 R; 351/163; 427/40; 428/542.8; 428/908.8

[58] Field of Search ............... 350/1.1, 311, 438, 439; 351/44, 160 R, 163; 427/40; 428/217, 542.8, 908.8

[56] References Cited

U.S. PATENT DOCUMENTS

| | | | |
|---|---|---|---|
| 3,961,103 | 6/1976 | Aisenberg | 427/39 |
| 4,006,340 | 2/1977 | Goriuas . | |
| 4,191,790 | 3/1980 | Chung et al. . | |
| 4,217,374 | 8/1980 | Ovshinsky | 427/53.1 |
| 4,319,811 | 3/1982 | Tu et al. . | |
| 4,382,100 | 5/1983 | Holland | 427/38 |
| 4,402,993 | 9/1983 | Aisenberg et al. | 427/38 |
| 4,434,188 | 2/1984 | Kamo et al. | 427/39 |
| 4,456,647 | 6/1984 | Schonfelder et al. . | |
| 4,474,857 | 10/1984 | Vaughn . | |
| 4,508,781 | 4/1985 | Yagi et al. | 427/40 |

FOREIGN PATENT DOCUMENTS

| | | |
|---|---|---|
| 102847 | 3/1984 | European Pat. Off. . |
| 150701 | 11/1981 | Japan . |
| 147868 | 7/1977 | United Kingdom . |

OTHER PUBLICATIONS

Aisenberg et al., *J. Appl. Physics*, 42 (7), 2953-8 (1971).
Whitmell et al., *Thin Solid Films*, 35, 255-261 (1976).
Holland et al., *Thin Solid Films*, 38, L17-19 (1976).
Ojha et al., *Thin Solid Films*, 40, L31-32 (1977).
Holland et al., *Thin Solid Films*, 48, L21-23 (1978).

*Primary Examiner*—James C. Cannon
*Attorney, Agent, or Firm*—Marvin S. Siskind; Richard M. Goldman; Kenneth M. Massaroni

[57] ABSTRACT

Coated lenses are provided that are suitable for optical and ophthalmic applications that include a coating for providing wear resistance and filtering of electromagnetic radiation in the range of from ultraviolet to about 500 nanometers or higher.

The coating comprises carbon and hydrogen and is preferably formed by a glow discharge deposition process.

25 Claims, 1 Drawing Sheet

COATED LENSES

RELATED APPLICATION

This application is a continuation or application Ser. No. 774,315, filed Sept. 10, 1985, and now abandoned.

This application is a continuation-in-part application of Ser. No. 649,324, filed Sept. 10, 1984, now U.S. Pat. No. 4,663,183.

FIELD OF THE INVENTION

The invention relates to lenses and more particularly to lenses having a protective coating for resistance to wear and for filtering harmful ultraviolet rays.

BACKGROUND OF THE INVENTION

Lenses can be made of many different types of transparent materials, such as glass or plastic, for example. Plastic lenses have increased in popularity in part because of relatively low cost and light weight. However, plastic lenses are generally more susceptible to abrasion and scratching. Glasses, including sunglasses, having plastic lenses also have wide popularity. However, most lenses do not filter out ultraviolet light, which is known to be harmful to eyes. For example, exposure to ultraviolet light can cause brown cataracts.

Sunglasses that do not filter out ultraviolet light can be even more dangerous, primarily for two reasons. First, the user is more likely to look at the sun more frequently, thereby increasing exposure to harmful ultraviolet rays. Second, dark lenses cause the pupils to expand, thereby allowing more ultraviolet light to enter the eye.

A need exists for a lens and in particular, an optical lens that has good abrasion and scratch resistance. A need also exists for such a lens that acts as a filter for light in the ultraviolet spectrum and other damaging wavelengths to protect eyes from such radiation that can cause brown cataracts. It is known that ultraviolet radiation (ultraviolet light has a wavelength range of from about 10 nanometers to about 390 nanometers) and violet light in the range of from about 390 to about 450 nanometers can be damaging to the human eye. It is known that light at a wavelength of 425 nanometers is the most dangerous from the standpoint of brown cataract formation. A need also exists for such a lens that is not dark colored, to enable use in regular eyeglasses or ophthalmic applications, for example.

Various attempts to coat optical lenses have been made.

European Application No. 101326, filed 2/22/84, discloses a plastic lens having an abrasion resistant coating thereover. The coating is formed by applying a liquid organosilanol material of a specific type and thereafter curing the coating by a glow discharge treatment.

U.S. Pat. No. 4,474,857 discloses a clear coated article with a silicone resin coating containing colloidal silica and a uv absorber. According to the disclosure, the coating is formed from an aqueous coating composition that comprises a dispersion of colloidal silica in an aliphatic alcohol-water solution of the partial condensate of a silanol compound of a specific formula.

SUMMARY OF THE INVENTION

In accordance with the present invention, a coated lens is provided that is resistant to scratching and abrasion and acts as a filter for ultraviolet light and other harmful radiation (electromagnetic radiation in the range of about 10 to about 450 nanometers).

The coated lens of the invention includes an optical substrate and a coating on at least a portion of one side of the substrate.

The coating is wear resistant and is substantially transparent to visible electromagnetic radiation in the red, orange, yellow, green and blue spectra. The coating acts to filter out at least a portion of the electromagnetic radiation in the range of about 10 to about 450 nanometers, thereby providing protection from harmful radiation.

The coating is carbonaceous and its composition comprises carbon and hydrogen. Preferably, the coating has an amorphous atomic structure, and is preferably made by glow discharge deposition from gaseous reactants.

The coating can be further characterized as having a high degree of hardness, which can approach, or even surpass, the hardness of tool steel (e.g. Rockwell C hardness 60), thereby providing resistance to scratching and abrasion.

The coatings useful in accordance with the invention can be further characterized by the absence of long range order and the presence of long range disorder that includes, inter alia, intersections of graphitic planes, and short range order including three-fold graphitic coordination and four-fold tetrahedral coordination, for example, at sites of intersecting and/or puckering of graphitic planes. The hard, carbonaceous films can have properties that approach those heretofore associated with crystalline carbon having tetrahedral, four-fold, carbon-carbon coordination.

The preferred coating deposition process allows formation of the coating at low temperature, allowing use on plastic optical substrates, for example. The method comprises the steps of decomposing a gaseous hydrocarbon, preferably under conditions where deposition of a solid film having long range disorder and short range trigonal and tetrahedral coordination is formed. These conditions include one or more of the following: (1) decomposing a reaction gas containing a hydrocarbon compound having carbon atoms tetrahedrally coordinated to carbon nearest neighbors through carbon-carbon bonds; (2) including a fluorine containing compound in the reaction gas; (3) depositing the film on a cathodically biased substrate; and (4) applying energy to raise the bonding levels in the carbon atoms, i.e., expanding the normally available bonding orbitals, as by applying separate d.c., radio frequency, or ion beam self biasing means to the substrate. The reaction gas is decomposed in a radio frequency maintained plasma, i.e., a glow discharge plasma, and the plasma decomposition products thereof are deposited on a substrate.

The coatings may be formed by glow discharge decomposition of gaseous hydrocarbons, especially one having tetrahedral coordination of carbon atoms and optionally in the presence of fluorine.

For lens applications, including optical and ophthalmic applications, the coatings can be deposited, for example, on plastic materials such as polycarbonates (e.g. General Electric "LEXAN", polyacrylates, poly-(allylcarbonates) (e.g. poly (diethylene glycol(bis(allylcarbonate)), polystyrene, acrylonitrile-styrene copolymers, PMMA (polymethylmethacrylate), ABS (acrylonitrile-butadiene-styrene copolymer), PVC (polyvinylchloride), and cellulose acetate, CAB (cellulose acetate butyrate) for example. Poly(diethylene glycol(bis(allylcarbonate)) can be formed from CR 39® monomer available from PPG Industries of Pittsburgh, Pa. It will be understood that the present invention is applicable to nearly any type of optical substrate material. It is only necessary that the substrate material be of a type on which the coating can be deposited with suitable adherence for an optical use.

Suitable compositions for coatings in accordance with the invention are about 40–95% carbon, about 5–60% hydrogen and 0–10% fluorine, on an atomic basis. A generally more suitable range is about 60–80% carbon, 20–40% hydrogen and 0–10% fluorine. The generally useful thickness range for optical applications is about 0.05 to about 1 micrometer and preferably 0.1 to about 0.5 micrometers.

The optical transmission and filtering qualities of the coating can be tailor made by adjusting the composition and processing parameters. For example, decreasing the hydrogen content in general increases the filtering of harmful visible and ultraviolet radiation. Increasing the ratio of the hydrocarbon reaction gas to the inert gas in general provides decreased transmittance in the higher wavelength ultraviolet region (200 to 390 nanometers) and in the lower wavelength visible region (390 nanometers to about 600 nanometers). Increasing the power of the glow discharge deposition process has a similar effect on transmittance.

The coatings and lenses of the invention are especially suitable for ophthalmic applications.

BRIEF DESCRIPTION OF THE DRAWINGS

The present invention can be more completely understood by reference to the drawings, in which.

DETAILED DESCRIPTION OF THE INVENTION

In forming the coating over at least a portion of the optical substrate, methane is preferred gaseous hydrocarbon. Other suitable gaseous hydrocarbons include ethane, propane and butane, and can be unsubstituted or substituted. Other useful hydrocarbons are characterized by having carbon atoms tetrahedrally coordinated to carbon nearest neighbors through carbon-carbon bonds. It is believed that the tetrahedral coordination of carbon to carbon nearest neighbor atoms through carbon-carbon single bonds in the precursor gas acts as a template for the replication of four-fold carbon-carbon coordination in the deposited film. Gaseous hydrocarbons are x,x-dialkyls having the formula

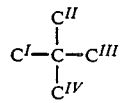

where C represents a four-fold coordinated central carbon atom and $C^I$, $C^{II}$, $C^{III}$ and $C^{IV}$ represent methyl groups, alkyl groups, and mixtures thereof can be used.

A representative compound of that type is 2,2-dimethyl propane, having the formula

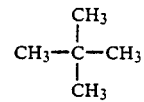

Other hydrocarbons having tetrahedrally coordinated central carbon atoms include 2,2-dimethyl butane, and 2,2,3,3-tetramethyl butane can be utilized as well as higher homologs thereof.

It is believed that the presence of a halogen compound, especially a fluorine compound, in the reaction gas, e.g., a hydrocarbon gas, whether or not the hydrocarbon gas contains carbon atoms four-fold coordinated with other carbon atoms, enhances both tetrahedral coordination of carbon and the presence of an effective amount of hydrogen in the film. Moreover, the presence of hydrogen reduces the tendency of the fluorine to etch the deposit. Suitable fluorine compounds include perfluorocarbons, e.g., $C_nF_{2n+2}$ where n is from 1 to about 8, and exemplified by carbon tetrafluoride, fluorinated hydrocarbons, e.g., $C_nF_{2n+2-m}H_m$ where n is from 1 to about 8, and m is less than $2n+2$, and exemplified by the fluoromethanes and fluoroethanes, and HF.

Accordingly, in a preferred glow discharge method, the gaseous hydrocarbon (including the optional halogen, e.g., fluorocarbon, if present) is in a gas mixture with inert gas. The inert gas may be helium, argon, neon, xenon or mixtures thereof. Preferably the inert gas is argon. The atomic ratio of the gaseous hydrocarbon to the carrier gas is from about 0.1:1.0 to about 10.0:1.0, depending on the desired properties of the deposited carbon film. The hardness and the filtered portion of the spectrum is a function of the ratio of hydrocarbon to argon. Thus, where the atomic ratio or volume ratio of hydrocarbon to argon is about 10:1, a relatively soft carbonaceous film is attained. When the volume ratio of hydrocarbon to argon is less than about 1.0/1, a relatively hard carbonaceous film is attained. When it is desired to obtain a relatively hard carbonaceous film, the volume ratio of hydrocarbon to argon is from about 0.1:1 to about 1:1.

Figure 1:
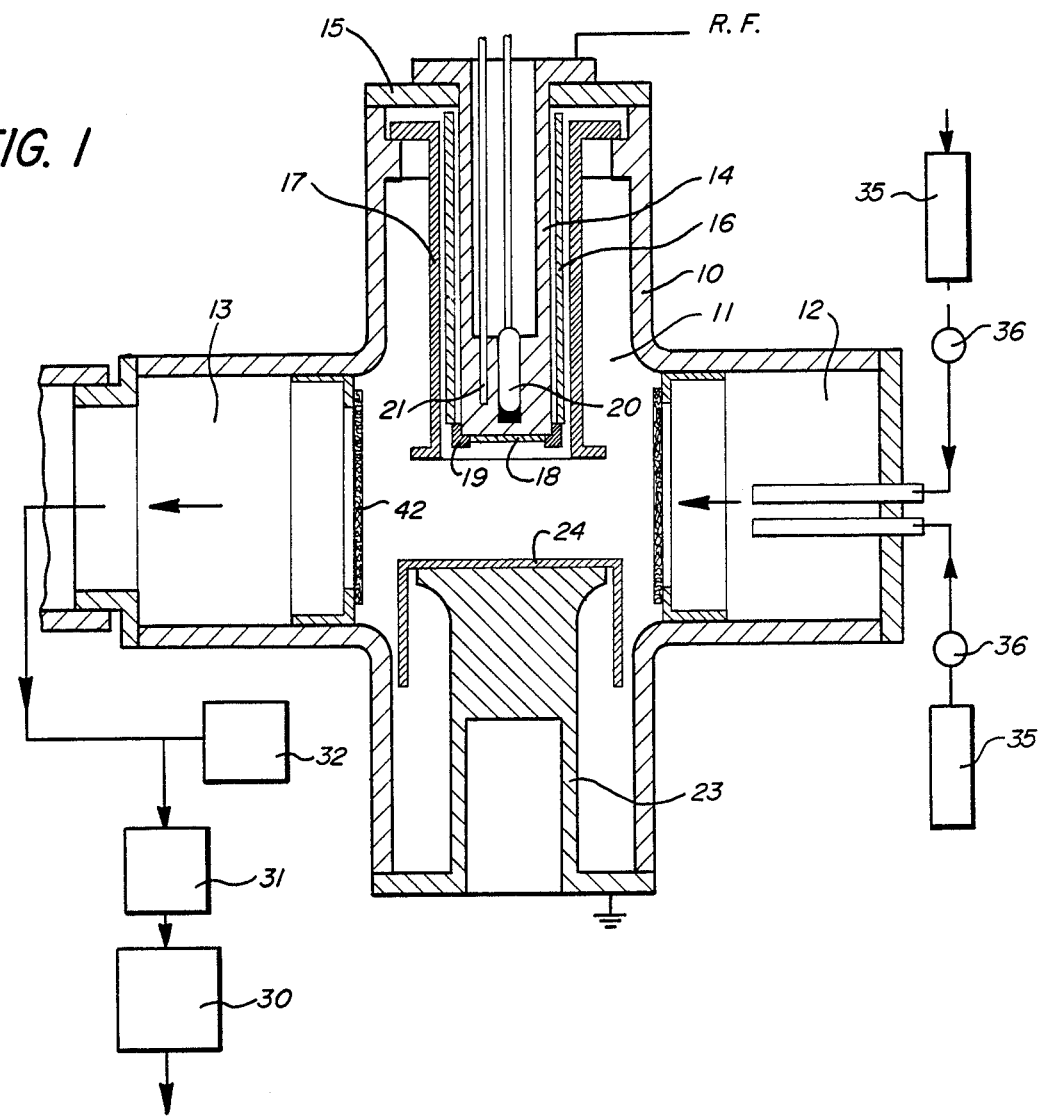
FIG. 1 is a diagrammatic illustration of the apparatus for the glow discharge decomposition of a reaction gas containing gaseous hydrocarbons and deposition of the resulting glow discharge decomposition product onto a cathodically biased substrate.

An apparatus useful for depositing the disordered carbon by glow discharge deposition is illustrated in FIG. 1. The apparatus includes a housing 10 having a vacuum chamber 11 and an inlet chamber 12 and an outlet chamber 13. A cathode backing member 14 is mounted in the vacuum chamber 11 through an insulator 15 and is provided with an insulating sleeve 16 and a dark space shield 17. A substrate 18, i.e., a cathodically biased substrate, is secured to the inner end of the cathode backing member 14 by a substrate holder 19 which may be joined to the cathode backing member 14 in electrical contact therewith.

The cathode backing member 14 may be provided with a well receiving an electrical heater for heating the cathode backing member 14. However, this is not necessary as the disordered carbon films may be deposited at room temperature on the contemplated low temperature process. When the cathode backing member 14 has a well for receiving an electrical heating element 20, the cathode backing member 14 may further have a temperature responsive probe 21, e.g., a thermocouple, for measuring the temperature of the cathode backing member.

The glow discharge decomposition apparatus further includes an electrode 23 secured in the vacuum chamber 11 and spaced from the cathode backing member 14. The electrode 23 is provided with a shield 24.

The space in the vacuum chamber 11 between the cathode backing member 14 and the electrode 23 provides space for glow discharge conditions therebetween. In this way, there is produced a plasma within the vacuum chamber 11 between the cathode backing member 14 and the electrode. As herein contemplated, the cathode is electrically connected to a source of radio frequency power which may be regulated. The electrode 23 is grounded whereby to provide the desired glow discharge there between.

The vacuum chamber 11 may be evacuated by a vacuum pump 30 and particle trap 31 and pressure gauge 32 indicating the vacuum pressure in the vacuum chamber.

The inlet chamber 12 of the housing 10 may be provided with a plurality of conduits for introducing materials into that housing 10. For example, in addition to the hydrocarbon gas, there may be provided fluorinated hydrocarbon gases or fluorocarbon gases whereby to provide fluorine in the deposited coating for substantially eliminating dangling bonds and providing a carbon-fluorine or carbon-fluorine-hydrogen alloy.

The inlet chamber 12 may be located remote from the vacuum chamber 11 for premixing the gases before they are fed into the vacuum chamber 11 of the housing. Thus, the gases, as the hydrocarbon gas and the fluorocarbon gas, may be fed to conduit 34 through filters or purifying devices 35 through suitable control means 36. The control means controls the rate of admission of materials into the vacuum chamber 11. The materials fed through the conduit 34 and mixed in the inlet chamber 12 are subjected to the glow discharge composition between the cathode 14 and the electrode 23 in the vacuum chamber 11. This provides the desired glow discharge decomposition and the formation of the disordered, diamond-like carbon on the substrate 18, optionally with the incorporation of the desired alterants or modifying elements therein as hydrogen and fluorine.

The coating may be formed on an optical substrate by a process where the substrate is moving and could be a continuous web. The deposition process is substantially continuous. For example, the process may be carried out with a deposition means including multichamber depositions, i.e., to provide a vertically arrayed structure.

According to one method for producing the coating on an optical substrate, the substrate is subjected to a precleaning step. This includes, for example, a detergent wash followed by a deionized water rinse and an alcohol rinse (e.g., isopropanol). Thereafter, the substrate is desiccated to ensure dryness.

The system is pumped down to a pressure less than about $5 \times 10^{-8}$ torr prior to deposition. Thereafter, a hydrocarbon gas optionally with a carrier as an inert gas such as helium, argon, neon, or a mixture thereof, and optionally with fluorocarbon gases as tetrafluoromethane, (carbon tetrafluoride) difluoromethane or the like are fed into the inlet chamber 12 through one of the conduits 34. The gas mixture is fed at a constant rate of about 100 standard cubic centimeters per minute total gas into the vacuum chamber 11. The vacuum chamber is maintained at a total pressure of about 50 to about 500 millitorrs and preferably from about 100–300 millitorr.

The partial pressure in the vacuum chamber 11 of the gases introduced therein provides a reactive atmosphere which contains the hydrocarbon and fluorocarbon gases as well as the carrier gas, e.g., argon. Generally, a plasma is generated in the atmosphere between the electrode and the cathode using a radio frequency power of from about 0.25 watts/per square inch of substrate to be coated to about preferably up to 5 watts/per square inch of substrate, operating at a radio frequency of from above about 0.1 megahertz, and generally for reasons of operational convenience, at about 13.56 megahertz.

By "radio frequency," also referred to herein as "r.f.," is meant that portion of the electromagnetic spectrum having frequencies between the audio portion of the electromagnetic spectrum and the far infrared portion of the electromagnetic spectrum, i.e., from 0.1 megahertz to about 100 gigahertz, and wavelengths corresponding thereto of from about $3 \times 10^3$ meters for 0.1 megahertz radiation to $3 \times 10^{-3}$ meter for 100 gigahertz radiation, and including "microwave" radiation.

By "microwave" is meant that portion of radio frequency radiation having frequencies in the gigahertz range, i.e., above about 1 gigahertz (which is the generally accepted definition found in the *IEEE Standard Dictionary of Electrical and Electronics Terms*, F. Jay, editor, IEEE, New York, N.Y. (1977) at page 416) and wavelengths corresponding thereto of less than about $3 \times 10^{-1}$ meter for 1 gigahertz radiation. The upper range of microwave radiation is less than the frequencies and wavelengths of the "far infrared" portion of the electromagnetic spectrum.

In the process, argon ions are attracted to the cathode and break the carbon hydrogen bonds. A subsequent carbon atom comes down to the substrate to take the place of the hydrogen. It is believed that the interaction of fluorine and hydrogen promotes the four-fold, tetrahedral, carbon-carbon coordination while avoiding etching by the fluorine.

Additionally, the application of bias energy to raise the bonding levels in the carbon atoms, that is, to expand the normally available bonding orbitals, and enhances both the tetrahedral-likeness of the coating and the rate of film growth. The energy may be applied by applying a d.c. field or bias across the deposition electrodes, by applying an r.f. field across the deposition electrodes, or even by applying an ion beam to deposit film. Thus, an external ion beam may be directed onto the substrate and/or growing film during film deposition whereby to get ion bombardment during deposition.

The process may be carried out to form a coating of from about 100 angstroms to about 100 microns thick. For optical uses, the thickness is preferably in the range of from about 0.1 micrometers to about 0.5 micrometers.

The resulting deposited coatings, when subjected to Raman spectroscopy and to electron diffraction microscopy, indicated a disordered structure. Infrared spectroscopy indicated the low levels of C-H bonds, i.e., detectable by infrared spectroscopy and up to about 1 atomic percent of hydrogen.

As the power applied to the plasma increases, i.e., from less than about 0.25 watts to 5 or more watts, the hydrogen in the deposit decreases, and the deposit gets darker and harder. Similarly, when the ratio of hydrocarbon gas to argon decreases, the hardness increases.

The deposit is preferably prepared at a low temperature, i.e., with the substrate at about 20° to 100° C., although higher temperatures may be utilized without deleterious effect. The practical upper temperature limit of the substrate will, of course, depend upon the effect of temperature upon a particular substrate and material to be deposited. Temperatures which deleteriously affect the substrate or the desired properties of the coating generally should be avoided.

Figure 2:
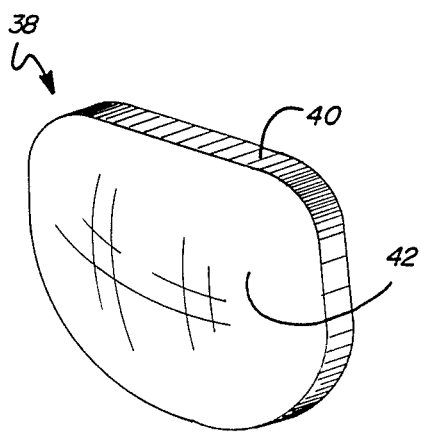
FIG. 2 is a perspective view of a coated optical lens.
Figure 3:
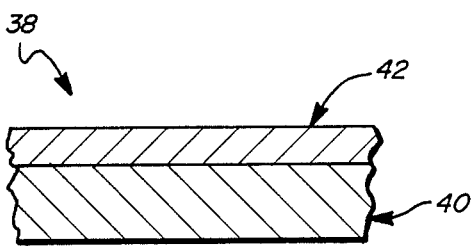
FIG. 3 is a sectional view of a portion of the optical lens of FIG. 2.

Referring to FIG. 2, there is illustrated a coated optical lens 38 in accordance with the invention. Optical lens 38 includes an optical substrate 40 and an amorphous carbon and hydrogen coating that was formed by glow discharge. FIG. 3 illustrates a portion of optical lens 38 in sectional view. The coating can be applied to other types lenses, such as contact lenses.

The disclosure of U.S. Ser. No. 649,324, filed Sept. 10, 1984, is hereby incorporated by reference.

EXAMPLE 1

A coating was prepared in accordance with the invention on a glass substrate. The glow discharge apparatus previously disclosed was utilized in forming a reaction gas mixture of a hydrocarbon and argon, passing the gas through the vacuum chamber, with the substrate at the cathode. The following parameters were used: gases methane and argon; gas flow rate: 50 SCCM methane, 50 SCCM argon; power (RF watts at 13.56 MHz): 0.25 watts/square inch of substrate; substrate temperature: room temperature; gas pressure: 200 millitorr; substrate to anode distance: 5 centimeters. The resultant film formed by this deposition process had a thickness of about 8,200A and transmittance values of 50% at 350 nanometers, 20% at 310 nanometers and 0% at 250 nanometers.

EXAMPLE 2

A coating was prepared as described in Example 1 except that the power was 0.5 watts/square inch. The coating had a thickness of about 8,000A and transmittance values of 50% at 620 nanometers, 20% at 500 nanometers and 0% at 380 nanometers.

EXAMPLE 3

A coating was prepared as described in Example 1 except that the power was 0.5 watts/square inch and the gas flow rate was 80 SCCM methane and 20 SCCM argon. The coating had a thickness of 7,500A and transmittance values of 50% at 470 nanometers, 20% at 400 nanometers and 0% at 310 nanometers.

EXAMPLE 4

A coating was prepared as described in Example 1 except that the power was 1.5 watts/square inch. The coating had a thickness of 7,000A and transmittance values of 50% at 740 nanometers, 20% at 580 nanometers and 0% at 420 nanometers.

EXAMPLE 5

A coating was prepared as described in Example 1 except that the gases and gas flow rate were 48 SCCM methane, 2 SCCM carbon tetrafluoride and 50 SCCM argon and the power was 0.5 watts/square inch. The coating had a thickness of 7,700A and transmittance values of 50% at 480 nanometers, 20% at 410 nanometers and 0% at 340 nanometers.

EXAMPLE 6

A coating was prepared as described in Example 1 except that the gases and gas flow rates were 50 SCCM n-butane and 50 SCCM argon and the power was 0.5 watts/square inch. The coating had a thickness of 9,400A and transmittance values of 50% at 390 nanometers, 20% at 350 nanometers and 0% at 310 nanometers.

EXAMPLE 7

A coating was prepared as described in Example 1 except that the gases and gas flow rates were 50 SCCM 2,2 dimethylpropane and 50 SCCM argon and the power was 0.5 watts/square inch. The coating had a thickness of 6,700A and transmittance values of 50% at 320 nanometers, 20% at 280 nanometers and 0% at 240 nanometers.

EXAMPLE 8

A coating was prepared as described in Example 1 except that 1,3 butadiene was substituted for methane. The coating had a thickness of about 5,900A and transmittance values of 50% at 370 nanometers, 20% at 310 nanometers and 0% at 260 nanometers.

EXAMPLE 9

A coating was prepared as described in Example 8 except that the power was 1.0 watts/square inch. The coating had a thickness of about 8,800A and transmittance values of 50% at 500 nanometers, 20% at 420 nanometers and 0% at 380 nanometers.

While the invention has been described with respect to certain embodiments, the invention is capable of numerous changes, modifications and alterations as may come within the scope of the claims.

What is claimed is:

1. A coated lens comprising:
   an optical substrate; and
   a wear, scratch and abrasion resistant, hard, transparent solid coating over at least a portion of the optical substrate, said coating consisting essentially of carbon and hydrogen and being substantially transparent to electromagnetic radiation in the red to blue spectrum, said coating being capable of filtering electromagnetic radiation in the range of ultraviolet to about 450 nanometers, said coating having a composition on an atomic basis in the range of from about 40–95% carbon and 5–60% hydrogen.

2. The coated optical lens of claim 1, said coating having a composition on an atomic basis in the range of from about 60–80% carbon and 20–40% hydrogen.

3. The coated lens of claim 1 wherein the coating has a thickness in the range of from about 0.05 to about 1.0 micrometer.

4. The coated lens of claim 1 wherein the coating filters at least about 50% of 425 nanometer electromagnetic radiation.

5. The coating lens of claim 1 wherein the coating filters at least about 50% of electromagnetic radiation in the range of from about 200 nanometers to about 500 nanometers.

6. The coated lens of claim 1 wherein the optical substrate comprises material selected from the group consisting of polycarbonate, polystyrene, acrylonitrile-styrene copolymer, PMMA, ABS, PVC, CAB and cellulose acetate.

7. The coated lens of claim 1 wherein the substrate comprises poly(diethylene glycol(bis(allylcarbonate)).

8. The coated lens of claim 1 wherein the lens is an eyeglass lens.

9. The coated lens of claim 1 wherein the lens is a contact lens.

10. The coated lens of claim 1 wherein the lens is a sunglass lens.

11. The coated lens of claim 1 wherein the coating comprises amorphous material.

12. The coated lens of claim 1 wherein an inert gas is present with the reaction gas.

13. The coated lens of claim 12 wherein the inert gas is argon.

14. The coated lens of claim 1 wherein the coating is formed by glow discharge decomposition of a reaction gas.

15. The coated lens of claim 14 wherein the reaction gas comprises a hydrocarbon.

16. The coated lens of claim 14 wherein the reaction gas comprises n-butane.

17. The coated lens of claim 14 wherein the reaction gas comprises 2,2-dimethylpropane.

18. The coated lens of claim 14 wherein the reaction gas comprises an x,x-dialkyl hydrocarbon 19. The coated lens of claim 14 wherein the reaction gas comprises methane.

20. The coated lens of claim 14 wherein the reaction gas further comprises a fluorine compound and said coating further consists essentially of fluorine and has a composition on an atomic basis of 40-95% carbon, 5-60% hydrogen and up to 10% fluorine.

21. The coated lens of claim 20 wherein the fluorine compound is a fluorocarbon.

22. An ophthalmic lens for reducing the incidence of brown cataract formation comprising the coated lens of claim 1 wherein the coating filters at least 50% of electromagnetic radiation in the range of 200 to 600 nanometers.

23. The lens of claim 22 wherein said lens is a contact lens.

24. The lens of claim 22 wherein said lens is an eyeglass lens.

25. A coated lens comprising:

an optical substrate; and a wear, scratch and abrasion resistant, hard, transparent solid coating over at least a portion of the optical substrate, said coating consisting essentially of carbon, hydrogen and fluorine and being substantially transparent to electromagnetic radiation in the red to blue spectrum, said coating capable of filtering electromagnetic radiation in the range of ultraviolet to about 450 nanometers and said coating having a composition on an atomic basis in the range of form about 40-95% carbon, 5-60% hydrogen and up to about 10% fluorine.

* * * * *